United States Patent [19]
Kanoh et al.

[11] Patent Number: 5,810,913
[45] Date of Patent: Sep. 22, 1998

[54] ACTIVATING CATALYTIC SOLUTION FOR ELECTROLESS PLATING AND METHOD OF ELECTROLESS PLATING

[75] Inventors: Osamu Kanoh, Ohmihachiman; Atsuo Senda, deceased, late of Nagaokakyo, both of Japan, by Eiko Senda, Yoshio Senda, Hiroko Senda, Masako Senda

[73] Assignee: Murata Manufacturing Co., Ltd., Kyoto, Japan

[21] Appl. No.: 729,952

[22] Filed: Oct. 15, 1996

[30] Foreign Application Priority Data

Oct. 18, 1995 [JP] Japan .................................. 7-269566

[51] Int. Cl.$^6$ .................................... C23C 18/18
[52] U.S. Cl. ...................... 106/1.05; 106/1.11; 106/1.22
[58] Field of Search .................. 106/1.05, 1.11, 106/122

[56] References Cited

U.S. PATENT DOCUMENTS

| | | | |
|---|---|---|---|
| 3,615,735 | 10/1971 | Shipley, Jr. ............................ | 106/1.22 |
| 3,754,939 | 8/1973 | Pearlstein et al. ..................... | 106/1.22 |
| 4,076,949 | 2/1978 | Zehner .................................. | 558/353 |
| 4,473,705 | 9/1984 | Miyamori et al. ..................... | 560/193 |
| 4,681,630 | 7/1987 | Brasch .................................. | 106/1.11 |
| 4,734,299 | 3/1988 | Matuzaki et al. ..................... | 106/1.11 |
| 5,411,795 | 5/1995 | Silverman ............................. | 428/902 |
| 5,445,997 | 8/1995 | Fujishima et al. ..................... | 437/228 |
| 5,498,467 | 3/1996 | Meola .................................... | 428/198 |

*Primary Examiner*—Cathy T. Lam
*Attorney, Agent, or Firm*—Ostrolenk, Faber, Gerb & Soffen, LLP

[57] ABSTRACT

There is provided a method of forming a conductive film having a predetermined pattern in hybrid ICs, high frequency dielectric filters and the like which makes it possible to safely and efficiently perform a series of the steps of preparing an activating catalytic solution for forming a photoreactive film on a base, forming the photoreactive film through the application of the activating catalytic solution, producing an activating catalyst by exposing particular regions of the photoreactive film, developing by flushing away the photoreactive film in unexposed regions, and immersing the base in an electroless plating bath without using an organic solvent and which allows the formation of a plating film having high electrical conductivity and high strength of adherence. A hydrophilic activating catalytic solution is used which is obtained by dissolving copper oxalate, a palladium salt such as palladium chloride into an alkaline solution such as ammonia. Since the activating catalytic solution itself does not include any organic solvent, the photoreactive film can be flushed away in unexposed regions using water at the developing step, which allows immediate immersion into an electroless plating bath.

11 Claims, No Drawings

ACTIVATING CATALYTIC SOLUTION FOR ELECTROLESS PLATING AND METHOD OF ELECTROLESS PLATING

BACKGROUND OF THE INVENTION

1. Field of the Invention

The present invention relates to an activating catalytic solution for electroless plating and a method of electroless plating utilizing the same.

2. Description of the Related Art

Electroless plating is sometimes used for forming a conductive film having a predetermined pattern for a coil for high frequencies, dielectric filter, capacitor, hybrid IC or the like, on an base such as an alumina substrate, dielectric ceramic substrate, polyimide substrate, glass epoxy substrate or ferrite substrate. When electroless plating is performed, the surface of the base must be activated, and an activating catalytic solution is used for such activation.

The activating catalytic solution is applied to the base to form a photoreactive film on the base. Attracting attention are activating catalytic solutions for forming such a photoreactive film in which activation selectively takes place only in regions irradiated with ultraviolet rays or laser beams and, therefore, electroless plating can be selectively performed only in those particular regions. With such an activating catalytic solution, a conductive film having a fine pattern can be efficiently formed on the base substrate using photolithography.

As an activating catalytic solution which provides the above-described feature, for example, a product obtained by dissolving palladium acetylacetonate into an organic solvent such as chloroform has conventionally been used. Such an activating catalytic solution is applied to an appropriate base to form a photoreactive film thereon which is in turn irradiated with laser beams or ultraviolet rays through a photomask. As a result, palladium metal is deposited on the base only in regions which are exposed. Thereafter, the photomask is removed. Photoreactive films in regions which have not been exposed are flushed away using an organic solvent such as chloroform. Thus, films made of palladium metal which have been left will be developed in a pattern corresponding to the pattern of the photomask. By immersing this base in an electroless plating bath, an electroless plating film is formed on the base using palladium metal as an activating catalyst. This process is hereinafter referred to as the "first conventional technique".

Meanwhile, a method of selective electroless plating utilizing an activating catalytic solution obtained by dissolving ferric oxalate and palladium chloride into a solution of potassium hydrate is described in "SELECTIVE PLATING OF COPPER FOR CIRCUITIZATION OF TEFLON AND EPOXY-BASED SUBSTRATES" by Thomas H. Baum et al. in "The Electrochemical Society Proceedings", Vol. 94–31 (hereinafter referred to as the "second conventional technique").

In the above-described first conventional technique, an organic solvent such as chloroform must be used in the developing step. Since such an organic solvent is harmful, it can not be readily used in large amounts. It is therefore relatively difficult to completely flush away photoreactive films which have not been exposed to the light. If any unexposed photoreactive film remains in place, there will be a problem in that the clearness of the pattern of the plating film produced by subsequent electroless plating will be lost. There is another problem in that the exposure involves high cost because the exposure of a photoreactive film requires a light source having high energy such as an excimer laser and takes time.

On the other hand, the developing step according to the second conventional technique can be carried out using water because hydrophilic palladium chloride is used. It is therefore easy to completely flush away photoreactive films which have not been exposed using a large amount of water. However, the photoreactive film obtained by this second conventional technique has a low sensitivity to exposure and, therefore, the exposure of the same also takes time. Further, a metal film obtained by means of electroless plating using such a photoreactive film as an activating catalyst has a problem in that it has a relatively low electrical conductivity which reduces high frequency characteristics. In addition, such an electroless-plated metal film has another problem in that the strength of its adherence to the base is relatively low. Although the strength of adherence can be improved by etching the surface of the base, such etching can be difficult depending on the quality of the base.

SUMMARY OF THE INVENTION

It is therefore an object of the present invention to provide an activating catalytic solution for electroless plating and a method of electroless plating using the same in which the problems with the first and second conventional techniques as described above can be solved.

An activating catalytic solution for electroless plating according to the present invention is a hydrophilic liquid including copper oxalate, a palladium salt and an alkaline solution. Preferably, palladium chloride is used as the palladium salt, and ammonia solution are used as the alkaline solution. In order to make it easier to apply such an activating catalytic solution to a base uniformly, for example, a hydrophilic binder such as polyvinyl alcohol may be added to the activating catalytic solution.

According to the present invention, there is provided a method of electroless plating wherein an activating catalytic solution as described above is applied to a base to form a photoreactive film made of the activating catalytic solution on the base. This photoreactive film is irradiated with light to deposit metal palladium on the base. Then, the base having palladium metal deposited thereon is immersed in an electroless plating bath to form an electroless plating film on the base using the palladium metal as an activating catalyst.

In the above-described method of electroless plating, if the photoreactive film is irradiated with light only in particular regions by irradiating it with light such as ultraviolet rays through a photomask or by scanning it with light such as laser beams, a developing step is preferably added wherein regions of the activating film which have not been irradiated with the light are flushed away by water or a liquid mainly constituted by water.

Since the activating catalytic solution according to the present invention is hydrophilic, it can serve as an activating catalytic solution for electroless plating without the need for an organic solvent and a developing step can be carried out as needed. This makes it possible to perform all of the steps that is, the step of preparing the activating catalytic solution, the step of applying it to a base, the developing step, and the electroless plating step, using processes and operations based on water.

Therefore, the method of electroless plating utilizing an activating catalytic solution according to the present invention can be safe first of all. Cost reduction can be expected from the use of water instead of an organic solvent. When the developing step is carried out, since flushing can be performed using water in this step, photoreactive films which have not been irradiated with light can be flushed away using a large amount of water without concern about harmfulness. This makes it possible to eliminate unnecessary photoreactive films completely, thereby allowing the formation of finer patterns. Further, regardless of whether the water used at the developing step remains, the subsequent electroless plating step can be immediately carried out. This makes it possible to perform a series of operations for electroless plating efficiently.

Moreover, an activating catalytic solution according to the present invention has a high sensitivity to light. Therefore, sufficient reaction can be obtained to deposit palladium metal even if the light such as ultraviolet rays for exposure has small energy or the exposure time is short. For example, it has been confirmed that palladium metal can be deposited after exposure for two minutes using an inexpensive mercury lamp. On the contrary, the first conventional technique involves exposure time of five minutes for deposition despite of the fact that it employs an expensive excimer laser.

Further, a plating film obtained by electroless plating carried out using an activating catalytic solution according to the present invention exhibits high adherence strength to the base. Since sufficient adherence strength can be thus obtained without etching the base in advance, a plating film can be formed with sufficient adherence strength using electroless plating even on a base which is difficult to etch.

Furthermore, in a plating film obtained by electroless plating carried out using an activating catalytic solution according to the present invention, the intrinsic electrical conductivity of the metal constituting the plating film can be maintained. Therefore, such a plating film can be applied to high frequency circuit elements without any problem.

DETAILED DESCRIPTION OF THE INVENTION

According to an embodiment of the present invention, 10 ml of an activating catalytic solution having the composition shown below was prepared by dissolving $Cu(COO)_2.1/2H_2O$ and $PdCl_2$ into ammonia solution, diluting the product with water, adding polyvinyl alcohol thereto, mixing and filtering the mixed solution using a 0.45 $\mu$m millipore filter.

$CU(COO)_2.1/2H_2O$:0.1 g $PdCl_2$: 0.1 g acq. ammonia (25%):2 ml water:7 ml

10% polyvinyl alcohol solution:1 ml

Next, the above-described activating catalytic solution was spin-coated on an alumina substrate at 1000 rpm/30 sec. to form an activating film. The photoreactive film was then irradiated with ultraviolet rays from an excimer lamp (wavelength:172 nm) through quartz.chrome photomask for three minutes; it was then washed with water; and an electroless plating process was performed by immersing it in an electroless plating bath of one liter (60° C.) containing the composition shown below for ten minutes.

$NiSO_4.6H_2O$:30 g sodium hypophosphite:10 g sodium acetate (anhydride):10 g

A Ni pattern having a thickness of 0.3 $\mu$m and a line space of 50 $\mu$m was formed on the substrate.

The above-described composition of the activating catalytic solution is only an example. For example, the content of $Cu(COO)_2.1/2H_2O$, $PdCl_2$, and ammonia solution (25%) in 10 ml of the activating catalytic solution can be varied within ranges from about 0.05 to 0.15 g, from about 0.01 to 0.15 g, and from about 1 to 5 ml, respectively. Preferred amounts are about 0.07 to 0.13/10 ml, about 0.03 to 0.13 g/10 ml and about 2 to 4 ml/10 ml, respectively. Further, $PdCl_2$ may be replaced with other hydrophilic salts, e.g., sulfates, nitrates, and acetates of palladium, and the ammonia solution with aqueous sodium hydroxide and the like. The pH of the water is preferably about 8 to 14 and more preferably about 9 to 13.

The wavelength of the light with which the photoreactive film is irradiated can be varied within a range from about 100 to 400 nm.

Although the electroless plating of nickel is performed in the above-described embodiment, the present invention may be applied to the electroless plating of other metals such as copper, palladium, silver and gold.

The base to be processed using electroless plating is not limited to an alumina substrate as described above, and other bases such as dielectric ceramic substrates, polyimide substrates, glass epoxy substrates, and ferrite substrates may be processed.

Further, in the method of electroless plating according to the present invention, the above-described developing step by means of water washing may be omitted. For example, the developing step may be omitted not only when a photoreactive film is entirely exposed instead of being selectively exposed in particular regions but also when, even if particular regions are selectively exposed, the resolution of the plating film to be formed is not required to be so high. The reason for the fact that the developing step can be omitted is that the activating catalytic solution is hydrophilic unlike the above-described first conventional technique.

In addition, when the developing step is performed, the water washing may be carried out using a liquid mainly constituted by water instead of water alone. This does not inhibit the use of other liquids.

While a particular embodiment of the present invention has been described, it will be obvious to those skilled in the art that changes and modifications may be made without departing from this invention in its broader aspects and, therefore the appended claims are to encompass within their scope all such changes and modifications as fall within the spirit and scope of this invention.

What is claimed is:

1. A hydrophilic activating catalytic solution for electroless plating comprising copper oxalate, palladium salt and an alkaline solution.

2. An activating catalytic solution for electroless plating according to claim 1, wherein said palladium salt is palladium chloride.

3. An activating catalytic solution for electroless plating according to claim 2, wherein said alkaline solution is ammonia solution.

4. An activating catalytic solution for electroless plating according to claim 3, wherein in each 10 ml of catalytic solution the amount of copper oxalate is from about 0.05–0.15 g, the amount of palladium salt is from about 0.01–0.15 g and the amount of alkaline solution is from about 1–5 ml.

5. An activating catalytic solution for electroless plating according to claim 2, wherein in each 10 ml of catalytic solution the amount of copper oxalate is from about 0.05–0.15 g, the amount of palladium salt is from about 0.01–0.15 g and the amount of alkaline solution is from about 1–5 ml.

6. An activating catalytic solution for electroless plating according to claim 1, wherein in each 10 ml of catalytic solution the amount of copper oxalate is from about 0.05–0.15 g, the amount of palladium salt is from about 0.01–0.15 g and the amount of alkaline solution is from about 1–5 ml.

7. An activating catalytic solution for electroless plating according to claim 1, wherein said alkaline solution comprises ammonia.

8. An activating catalytic solution for electroless plating according to claim 2, wherein said alkaline solution comprises sodium hydroxide.

9. An activating catalytic solution for electroless plating according to claim 1, wherein said alkaline solution comprises sodium hydroxide.

10. A substrate for electroless plating having thereon a film thereon in which said film is a hydrophilic activating catalytic solution for electroless plating comprising copper oxalate, palladium salt and an alkaline liquid.

11. A substrate for electroless plating having thereon a film thereon according to claim 10 in which the film is present in selected regions of said substrate.

* * * * *